US009301382B2

(12) United States Patent
Ershov et al.

(10) Patent No.: US 9,301,382 B2
(45) Date of Patent: Mar. 29, 2016

(54) APPARATUS FOR AND METHOD OF SOURCE MATERIAL DELIVERY IN A LASER PRODUCED PLASMA EUV LIGHT SOURCE

(71) Applicant: Cymer LLC, San Diego, CA (US)

(72) Inventors: Alexander I. Ershov, Escondido, CA (US); David Evans, Escondido, CA (US); Matthew Graham, Escondido, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/094,361

(22) Filed: Dec. 2, 2013

(65) Prior Publication Data

US 2015/0156855 A1     Jun. 4, 2015

(51) Int. Cl.
*H05G 2/00*     (2006.01)
*G03F 7/20*     (2006.01)

(52) U.S. Cl.
CPC ............. *H05G 2/006* (2013.01); *G03F 7/2008* (2013.01); *H05G 2/005* (2013.01); *H05G 2/008* (2013.01)

(58) Field of Classification Search
CPC ....... H05G 2/008; H05G 2/003; H05G 2/006; H05G 2/005; G03F 7/2008
See application file for complete search history.

(56) References Cited

U.S. PATENT DOCUMENTS

| | | | |
|---|---|---|---|
| 8,263,953 B2 * | 9/2012 | Fomenkov | H05G 2/005 |
| | | | 250/493.1 |
| 8,507,882 B2 * | 8/2013 | Swinkels | G03F 7/70033 |
| | | | 250/504 R |
| 2001/0006217 A1 * | 7/2001 | Bisschops | B82Y 10/00 |
| | | | 250/493.1 |
| 2006/0226377 A1 | 10/2006 | Hergenhan et al. | |
| 2008/0258085 A1 * | 10/2008 | Bauer | H05G 2/001 |
| | | | 250/504 R |
| 2009/0230326 A1 * | 9/2009 | Vaschenko | H05G 2/003 |
| | | | 250/492.2 |
| 2009/0314967 A1 * | 12/2009 | Moriya | G03F 7/70191 |
| | | | 250/504 R |
| 2010/0140514 A1 * | 6/2010 | Bykanov | G03F 7/70033 |
| | | | 250/504 R |
| 2010/0258748 A1 * | 10/2010 | Vaschenko | H05G 2/003 |
| | | | 250/504 R |
| 2011/0170079 A1 * | 7/2011 | Banine | G03F 7/70175 |
| | | | 355/30 |
| 2011/0248191 A1 * | 10/2011 | Fomenkov | H05G 2/005 |
| | | | 250/504 R |

(Continued)

FOREIGN PATENT DOCUMENTS

| | | |
|---|---|---|
| EP | 1 367 441 A2 | 12/2003 |
| EP | 2 159 638 A1 | 3/2010 |
| WO | WO 01/49086 A1 | 7/2001 |

OTHER PUBLICATIONS

International Search Report and Written Opinion of PCT Application No. PCT/IB2014/002998, filed Nov. 6, 2014. (15 pages).

*Primary Examiner* — Wyatt Stoffa
(74) *Attorney, Agent, or Firm* — Arent Fox LLP

(57) ABSTRACT

A device and method are disclosed in which gas is caused to flow parallel to a flow of source material to form a gas shroud. The gas shroud may protect flow of source material from being disrupted by a cross flow of gas. The gas shroud may also limit heating of a physical shroud through which the source material passes and limit accumulation of source material on the physical shroud by deforming a plasma bubble formed during irradiation of the source material so that the plasma bubble does not come too near the physical shroud. A device and method are also disclosed for establishing an additional transverse flow of gas so that the gas shroud does not cause source material contamination of an optic used to collect light generated during irradiation of the source material.

20 Claims, 10 Drawing Sheets

(56) References Cited

U.S. PATENT DOCUMENTS

| | | | |
|---|---|---|---|
| 2012/0305810 A1* | 12/2012 | Ershov | G03F 7/70033 250/504 R |
| 2013/0126761 A1* | 5/2013 | Nagai | H05G 2/005 250/504 R |
| 2013/0161540 A1* | 6/2013 | Nagai | H05G 2/005 250/504 R |
| 2013/0313423 A1* | 11/2013 | Umstadter | H05G 2/003 250/282 |
| 2014/0078480 A1* | 3/2014 | Park | G03F 7/20 355/67 |

* cited by examiner

APPARATUS FOR AND METHOD OF SOURCE MATERIAL DELIVERY IN A LASER PRODUCED PLASMA EUV LIGHT SOURCE

FIELD

The present disclosure relates to extreme ultraviolet ("EUV") light sources that provide EUV light from a plasma that is created from a target material and collected and directed to an intermediate region for utilization outside of the EUV light source chamber, e.g., by a lithography scanner/stepper.

BACKGROUND

Extreme ultraviolet ("EUV") light, e.g., electromagnetic radiation having wavelengths of around 50 nm or less (also sometimes referred to as soft x-rays), and including light at a wavelength of about 13.5 nm, can be used in photolithography processes to produce extremely small features in substrates such as silicon wafers. Here and elsewhere, it will be understood that the term "light" is used to encompass electromagnetic radiation regardless of whether it is within the visible part of the spectrum.

Methods for generating EUV light include converting a source material from a liquid state into a plasma state. The source material preferably includes at least one element, e.g., xenon, lithium or tin, with one or more emission lines in the EUV part of the spectrum. In one such method, often termed laser produced plasma ("LPP"), the required plasma can be produced by using a laser beam to irradiate a source material having the required line-emitting element.

One LPP technique involves generating a stream of source material droplets and irradiating at least some of the droplets with laser light. In more theoretical terms, LPP light sources generate EUV radiation by depositing laser energy into a source material having at least one EUV emitting element, such as xenon (Xe), tin (Sn), or lithium (Li), creating a highly ionized plasma with electron temperatures of several 10's of eV.

The energetic radiation generated during de-excitation and recombination of these ions is emitted from the plasma in all directions. In one common arrangement, a near-normal-incidence mirror (an example of an EUV optic referred to as a collector or collector mirror) is positioned to collect, direct (and in some arrangements, focus) the light to an intermediate location. The collected light may then be relayed from the intermediate location to a set of scanner optics and ultimately to a wafer.

In some LPP systems each droplet is sequentially illuminated by multiple light pulses. In some cases, each droplet may be exposed to a so-called "pre-pulse" and then to a so-called "main pulse." It is to be appreciated, however, that the use of a pre-pulse is optional, that more than one pre-pulse may be used, that more than one main pulse may be used, and that the functions of the pre-pulse and main pulse may overlap to some extent.

In quantitative terms, one arrangement that is currently being developed with the goal of producing about 100 W at the intermediate location contemplates the use of a pulsed, focused 10-12 kW $CO_2$ drive laser which is synchronized with a droplet generator to sequentially irradiate about 10,000-200,000 tin droplets per second. For this purpose, there is a need to produce a stable stream of droplets at a relatively high repetition rate (e.g., 10-200 kHz or more) and deliver the droplets to an irradiation site with high accuracy and good repeatability in terms of timing and position over relatively long periods of time.

For LPP light sources, it may be desirable to use one or more gases in the chamber for ion-stopping, debris mitigation, optic cleaning and/or thermal control. In some cases these gases may be flowing, for example, to move plasma generated debris, such as vapor and/or microparticles in a desired direction, move heat toward a chamber exit, etc. In some cases, these flows may occur during LPP plasma production. For example, see U.S. Pat. No. 7,671,349, issued on Mar. 2, 2010, the entire contents of which are hereby incorporated by reference herein. Other setups may call for the use of non-flowing, i.e., static or nearly static, gases. The presence of these gasses, whether static or flowing and/or the creation/existence of the LPP plasma may alter/effect each droplet as it travels to the irradiation region adversely affecting droplet positional stability. This may reduce dose performance and hence output power.

In U.S. Pat. No. 7,872,245, issued on Jan. 18, 2011, the entire contents of which are hereby incorporated by reference herein, the use of a tube to envelop a portion of the droplet path as the droplets travel from a droplet release point to an irradiation region was described. As described, the tube was provided to shield and protect an EUV optic from droplets/target material that strayed from the desired path between a droplet release point and the irradiation region, e.g. during droplet generator startup or shutdown.

U.S. Pat. No. 8,263,953, issued Sep. 11, 2012, the entire contents of which are hereby incorporated by reference herein, discloses an arrangement in which gas flows in a direction toward the droplet stream and a shroud is positioned along a portion of the stream, the shroud having a first shroud portion shielding droplets from the flow.

With the above in mind, applicants disclose systems and methods for target material delivery protection in a laser produced plasma EUV light source, and corresponding methods of use.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect there is provided a device and method in which gas is caused to flow parallel to a flow of source material to form a gas shroud. The gas shroud may protect flow of source material from being disrupted by a cross flow of gas. The gas shroud may also limit heating of a physical shroud through which the source material passes and limit accumulation of source material on the physical shroud by deforming a plasma bubble formed during irradiation of the source material so that the plasma bubble does not come too near the physical shroud. A device and method are also disclosed for establishing an additional transverse flow of gas so that the gas shroud does not cause source material contamination of an optic used to collect light generated during irradiation of the source material.

In another aspect, there is provided a device including a chamber, a source material delivery system having a source material release point and adapted to deliver a stream of source material to an irradiation region within the chamber along a path between the source material release point and the irradiation region, and a first gas delivery system adapted to cause gas to flow in the chamber along at least a portion of the path. The source material delivery system may include a solid shroud extending from the source material release point and parallel the path to a solid shroud end to protect at least a portion of the stream, and the first gas delivery system may be adapted to cause gas to flow along at least a portion of the path between the solid shroud end and the irradiation region. The flow rate at which the first gas delivery system causes gas to flow in the chamber along at least a portion of the path may be large enough that a plasma bubble formed around the irradiation region when the source material in the stream is irradiated is forced away from the solid shroud end. The first gas delivery system may be adapted to cause gas to flow in the chamber along at least a portion of the path inside the solid shroud and out of the solid shroud end towards the irradiation region. The solid shroud may have a length parallel to the path and the first gas delivery system may be adapted to cause gas to flow in the chamber outside of the solid shroud and parallel to the length of the solid shroud and towards the irradiation region.

The device may include an EUV optic such as a collector and a second gas delivery system adapted to cause gas to flow from the direction of the EUV optic and towards the stream. The flow rate at which the first gas delivery system causes gas to flow in the chamber along at least a portion of the path may be large enough that the flow of gas from the second gas delivery system does not prevent the stream from passing through the irradiation region. The gas delivery system may be adapted to cause gas to flow through a central aperture in the EUV optic.

The device may also include a second gas delivery system which includes a gas delivery line arranged adjacent a substantially radially symmetric surface of the EUV optic confronting the irradiation region and extending substantially radially at least part of a distance between a central aperture in the EUV optic and an outer edge of the EUV optic. The second gas delivery system may include a first gas delivery line arranged adjacent a substantially radially symmetric surface of the EUV optic confronting the irradiation region and extending substantially radially at least part of a distance between a central aperture in the EUV optic and an outer edge of the EUV optic in a direction substantially parallel to the path for expelling gas along in a direction away from the EUV optic surface in a radial line. The second gas delivery system may also include a second gas delivery line arranged adjacent a substantially radially symmetric surface of the EUV optic confronting the irradiation region and extending substantially radially at least part of a distance between a central aperture in the EUV optic and an outer edge of the EUV optic in a direction substantially parallel to the path and radially opposite to the direction from the central aperture than the first gas delivery line.

According to another aspect, there is provided a device including a chamber having an irradiation region within, an EUV optic with a central aperture, a first gas delivery system in fluid communication with an interior of the chamber and adapted to cause gas to flow through the central aperture and towards the stream, a source material delivery system having a source material release point within the chamber and adapted to deliver a stream of source material to the irradiation region along a path between the source material release point and the irradiation region, the source material delivery system including a solid shroud extending from the source material release point and parallel the path to a solid shroud end to protect at least a portion of the stream, and a second gas delivery system in fluid communication with the interior of the chamber and adapted to cause gas to flow in the chamber along at least a portion of the path. The device may further include a first gas delivery line arranged adjacent a substantially radially symmetric surface of the EUV optic confronting the irradiation region and extending substantially radially at least part of a distance between a central aperture in the EUV optic and an outer edge of the EUV optic in a direction substantially parallel to the path for expelling gas along in a direction away from the EUV optic surface in a radial line.

According to yet another aspect there is provided a method including the steps of directing a stream of source material along a path between a source material release point in a chamber and an irradiation region in the chamber and streaming gas in the chamber along at least a portion of the path. The source material delivery system may include a solid shroud extending from the source material release point and parallel the path to a solid shroud end to protect at least a portion of the stream, and the streaming step may include streaming gas along at least a portion of the path between the solid shroud end and the irradiation region. The method may additionally include a step of irradiating the source material causing a plasma bubble to form and the streaming step may include causing gas to flow at a flow rate large enough that the plasma bubble is forced away from the solid shroud end.

The streaming step may also include causing gas to flow in the chamber along at least a portion of the path inside the solid shroud and out of the solid shroud end towards the irradiation region. The solid shroud may have a length parallel to the path and the streaming step may include causing gas to flow in the chamber outside of the solid shroud and parallel to the length of the solid shroud and towards the irradiation region.

The method may further include a step concurrent with the streaming step of causing gas to flow from the direction of an EUV optic and towards the path. The streaming step may then include streaming gas at a flow rate large enough that the flow of gas from the direction of an EUV optic and towards the path does not prevent the source material from passing through the irradiation region. The method may also include causing gas to flow into the chamber through a gas delivery line arranged adjacent a substantially radially symmetric surface of the EUV optic confronting an irradiation region and extending substantially radially at least part of a distance between a central aperture in the EUV optic and an outer edge of the EUV optic.

DETAILED DESCRIPTION

Figure 1:
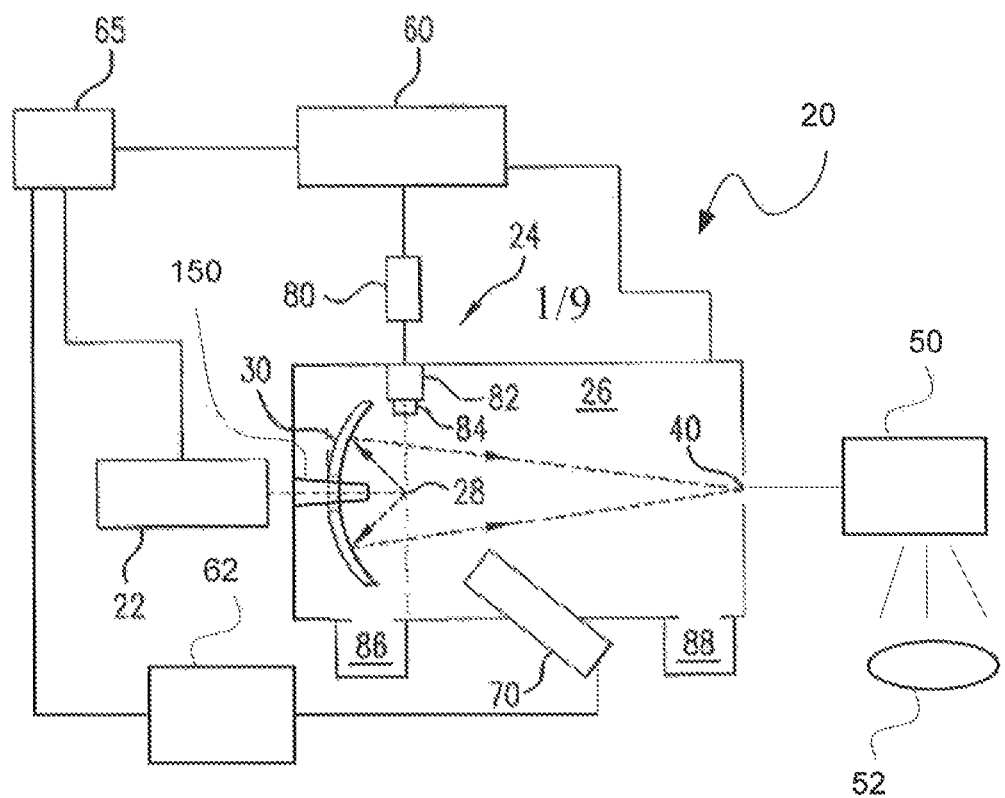
FIG. 1 shows a schematic not-to-scale view of an embodiment of a laser-produced-plasma EUV light source.

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments.

With initial reference to FIG. 1, there is shown a schematic view of an embodiment of an EUV light source, e.g., a laser-produced-plasma EUV light source 20. As shown in FIG. 1, and described in further detail below, the LPP light source 20 may include a system 22 for generating a train of light pulses and delivering the light pulses into a chamber 26. As detailed below, each light pulse may travel along a beam path from the system 22 and into the chamber 26 to illuminate a respective target droplet at an irradiation region 28. It should be noted that as used herein an irradiation region is a region for source material irradiation to occur, and is an irradiation region even at times when no irradiation is actually occurring.

Suitable lasers for use in the system 22 shown in FIG. 1, may include a pulsed laser device, e.g., a pulsed gas discharge $CO_2$ laser device producing radiation at 9.3 μm or 10.6 μm, e.g., with DC or RF excitation, operating at relatively high power, e.g., 10 kW or higher and high pulse repetition rate, e.g., 50 kHz or more. In one particular implementation, the laser may be an axial-flow RF-pumped $CO_2$ laser having an oscillator-amplifier configuration (e.g. master oscillator/power amplifier (MOPA) or power oscillator/power amplifier (POPA)) with multiple stages of amplification and having a seed pulse that is initiated by a Q-switched oscillator with relatively low energy and high repetition rate, e.g., capable of 100 kHz operation. From the oscillator, the laser pulse may then be amplified, shaped and/or focused before reaching the irradiation region 28. Continuously pumped $CO_2$ amplifiers may be used for the system 22. For example, a suitable $CO_2$ laser device having an oscillator and three amplifiers (O-PA1-PA2-PA3 configuration) is disclosed in U.S. Pat. No. 7,439,530, issued on Oct. 21, 2008, the entire contents of which are hereby incorporated by reference herein. Alternatively, the laser may be configured as a so-called "self-targeting" laser system in which the droplet serves as one mirror of the optical cavity. In some "self-targeting" arrangements, an oscillator may not be required. Self-targeting laser systems are disclosed and claimed in U.S. Pat. No. 7,491,954, issued on Feb. 17, 2009, the entire contents of which are hereby incorporated by reference herein.

Depending on the application, other types of lasers may also be suitable, e.g., an excimer or molecular fluorine laser operating at high power and high pulse repetition rate. Other examples include, a solid state laser, e.g., having a fiber, rod, slab or disk-shaped active media, other laser architectures having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, or a solid state laser that seeds one or more excimer, molecular fluorine or $CO_2$ amplifier or oscillator chambers, may be suitable. Other designs may be suitable.

As further shown in FIG. 1, the EUV light source 20 may also include a target material delivery system 24 delivering droplets of a target material into the interior of a chamber 26 to the irradiation region 28, where the droplets will interact with one or more light pulses, e.g., zero, one or more pre-pulses and thereafter one or more main pulses, to ultimately produce a plasma and generate an EUV emission. The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in U.S. Pat. No. 7,465,946, issued on Dec. 16, 2008, the entire contents of which are hereby incorporated by reference herein. In some cases, an electrical charge is placed on the source material to permit the source material to be steered toward or away from the irradiation region 28.

Continuing with FIG. 1, the light source 20 may also include one or more EUV optical elements such as EUV optic 30. The EUV optic 30 may be a collector in the form of a normal incidence reflector, for example, implemented as a multilayer mirror (MLM), that is, a SiC substrate coated with a Mo/Si multilayer with additional thin barrier layers deposited at each interface to effectively block thermally-induced interlayer diffusion. Other substrate materials, such as Al or Si, can also be used. The EUV optic 30 may be in the form of a prolate ellipsoid, with an aperture to allow the laser light to pass through and reach the irradiation region 28. The EUV optic 30 may be, e.g., in the shape of a ellipsoid that has a first focus at the irradiation region 28 and a second focus at a so-called intermediate point 40 (also called the intermediate focus 40) where the EUV light may be output from the EUV light source 20 and input to, e.g., an integrated circuit lithography tool 50 which uses the light, for example, to process a silicon wafer workpiece 52 in a known manner. The silicon wafer workpiece 52 is then additionally processed in a known manner to obtain an integrated circuit device.

The light source 20 can also include an open-ended, hollow conical shroud 150 (for example, a gas cone) that tapers toward irradiation region 28 from the EUV optic 30 to reduce the amount of plasma-generated debris that enters the focus assembly 22 and/or a beam transport system while allowing the amplified light beam to reach the irradiation region 28. For this purpose, a gas flow of for example H2 can be provided in the shroud 150 that is directed toward the irradiation region 28.

Continuing with reference to FIG. 1, the EUV light source 20 may also include an EUV controller 60, which may also include a firing control system 65 for triggering one or more lamps and/or laser devices in the system 22 to thereby generate light pulses for delivery into the chamber 26. The EUV light source 20 may also include a droplet position detection system which may include one or more droplet imagers 70 e.g., system(s) for capturing images using CCD's and/or backlight stroboscopic illumination and/or light curtains that provide an output indicative of the position and/or timing of one or more droplets, e.g., relative to the irradiation region 28. The imager(s) 70 may provide this output to a droplet position detection feedback system 62, which can, e.g., compute a droplet position and trajectory, from which a droplet error can be computed, e.g., on a droplet-by-droplet basis, or on average. The droplet position error may then be provided as an input to the controller 60, which can, for example, provide a position, direction and/or timing correction signal to the system 22 to control a source timing circuit and/or to control a beam position and shaping system, e.g., to change the trajectory and/or focal power of the light pulses being delivered to the irradiation region 28 in the chamber 26. Further details are provided in, see e.g., U.S. Pat. No. 7,087,914, issued on Aug. 8, 2006 and U.S. Pat. No. 7,164,144, issued on Jan. 16, 2007, the entire contents of each of which are hereby incorporated by reference herein.

The EUV light source 20 may include one or more EUV metrology instruments for measuring various properties of the EUV light generated by the source 20. These properties may include, for example, intensity (e.g., total intensity or intensity within a particular spectral band), spectral bandwidth, polarization, beam position, pointing, etc. For the EUV light source 20, the instrument(s) may be configured to operate while the downstream tool, e.g., photolithography scanner, is on-line, e.g., by sampling a portion of the EUV output, e.g., using a pickoff mirror or sampling "uncollected" EUV light, and/or may operate while the downstream tool, e.g., photolithography scanner, is off-line, for example, by measuring the entire EUV output of the BUY light source 20.

As further shown in FIG. 1, the EUV light source 20 may include a droplet control system 80, operable in response to a signal (which in some implementations may include the droplet error described above, or some quantity derived therefrom) from the controller 60, to e.g., modify the release point of the target material from a source material dispenser 82 and/or modify droplet formation timing, to correct for errors in the droplets arriving at the desired irradiation region 28, and/or synchronize the generation of droplets with the pulsed laser system 22.

FIG. 1 also schematically illustrates that the EUV light source 20 may include a shroud 84 for increasing droplet positional stability, i.e., as used herein, the term "droplet positional stability" and its derivatives means a measure of variation in path between a droplet and a successive droplet, as each droplet travels over some or all of the distance between a droplet release point and an irradiation region. Examples of shrouds suitable for use in the EUV light source 20 include, but are not necessarily limited to, those disclosed in U.S. Pat. No. 8,263,953 cited above.

FIG. 1 also schematically illustrates that one or more gases such as $H_2$, hydrogen radicals, He, Ar, HBr, HCl or combinations thereof, may be introduced into the chamber 26 via port 86, and exhausted therefrom using port 88. These gases may be used in the chamber 26, for example, for slowing fast moving ions generated by the LPP plasma to protect nearby optics, for debris mitigation including, but not limited to, blowing vapor and other debris away from an optic or other component, optic cleaning, such as etching or chemically altering a material the has deposited on an optic, or component and/or thermal control, such as removing heat from a particular optic/component, or to remove heat generally from the chamber. In some cases, these gases may be flowing, for example, to move plasma generated debris, such as vapor and/or microparticles in a desired direction, move heat toward a chamber exit, etc. In some cases, these flows may occur during LPP plasma production. Other setups may call for the use of non-flowing, i.e., static or nearly static, gases. As used herein, the term "static gas" means a gas in a volume which is not in fluid communication with an active pump. In some implementations, gases may be static during LPP plasma production and caused to flow between periods of LPP plasma production, e.g., flow may only occur between bursts of EUV light output. The presence of these gasses, whether static or flowing and/or the creation/existence of the LPP plasma may alter/effect each droplet as it travels to the irradiation region adversely affecting droplet positional stability. Further details regarding the use of gases in a LPP plasma chamber may be found in U.S. Pat. No. 7,671,349, issued on Mar. 2, 2010, U.S. Pat. No. 7,872,245, issued on Jan. 18, 2011, U.S. Pat. No. 7,655,925, issued on Feb. 20, 2010, and U.S. Pat. No. 6,972,421, issued on Dec. 6, 2005, the entire contents of each of which are hereby incorporated by reference herein.

Figure 2:
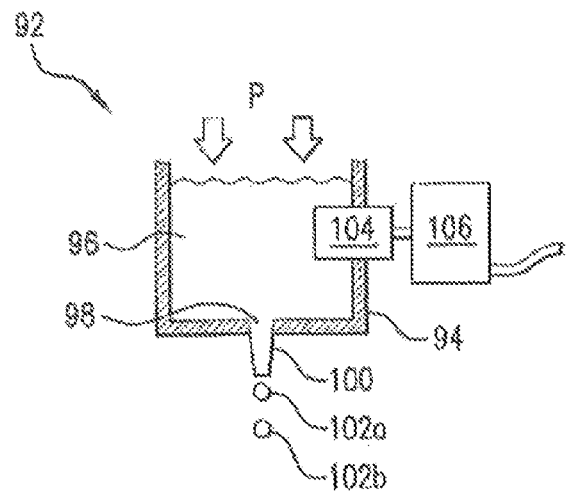
FIG. 2 shows a simplified schematic view of a source material dispenser.

FIG. 2 illustrates in schematic format the components of a simplified source material dispenser 92 that may be used in some or all of the embodiments described herein. As shown there, the source material dispenser 92 may include a conduit, which for the case shown, is a reservoir 94 holding a fluid 96, e.g., molten tin, under pressure, P. Also shown, the reservoir 94 may be formed with an orifice 98 allowing the pressurized fluid 96 to flow through the orifice establishing a continuous stream 100 which subsequently breaks into a plurality of droplets 102a, b. The orifice 98 defines a release point for the source material dispenser 92, although one of ordinary skill in the art will readily appreciate that this is not a point in the mathematical sense but instead refers to the location where the source material leaves the source material dispenser 92.

Continuing with FIG. 2, the source material dispenser 92 further includes a sub-system producing a disturbance in the fluid having an electro-actuatable element 104 that is operably coupled with the fluid 98 and a signal generator 106 driving the electro-actuatable element 104. In one setup, a fluid is forced to flow from a reservoir under pressure through a conduit, e.g., capillary tube, having a relatively small diameter and a length of about 10 to 50 mm, creating a continuous stream exiting an orifice of the conduit, which subsequently breaks up into droplets and an electro-actuatable element, e.g., having a ring-like or tube-like shape, may be positioned around the tube. When driven, the electro-actuatable element may selectively squeeze the conduit to disturb the stream.

More details regarding various droplet dispenser configurations and their relative advantages may be found in U.S. Pat. No. 7,872,245, issued on Jan. 18, 2011; U.S. Pat. No. 7,897,947, issued on Mar. 1, 2011; U.S. patent application Ser. No. 11/358,988, filed on Feb. 21, 2006, titled LASER PRODUCED PLASMA EUV LIGHT SOURCE WITH PRE-PULSE, and published on Nov. 16, 2006 as US2006/0255298A-1; U.S. Pat. No. 7,405,416, issued on Jul. 29, 2008; and U.S. Pat. No. 7,372,056, issued on May 13, 2008; the entire contents of each of which are hereby incorporated by reference herein.

Figure 3:
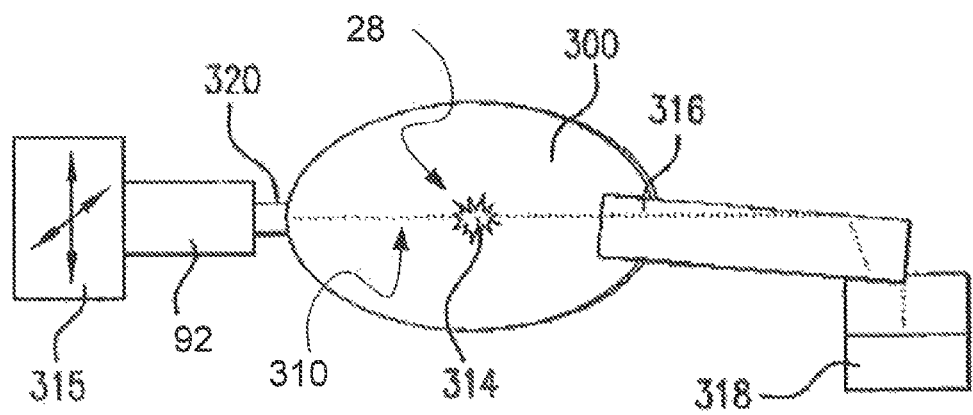
FIG. 3 shows a simplified, diagram showing a shroud positioned along a portion of a droplet stream with the shroud partially enveloping the stream in a plane normal to the droplet stream path direction to increase droplet positional stability.

Referring now to FIG. 3, a device is shown having an EUV reflective optic 300, e.g., a near-normal incidence EUV optic mirror having a reflective surface in the form of a rotated ellipse having a graded multi-layer coating with alternating layers of molybdenum and silicon, and in some cases, one or more high temperature diffusion barrier layers, smoothing layers, capping layers and/or etch stop layers. FIG. 3 also shows that the device may further include a system delivering target material 310, e.g., a stream of target material droplets, the system having a target material release point. A system generating a laser beam (see FIG. 1) may also be provided for irradiating the target material at an irradiation region to create a primary plasma 314 to generate an EUV emission. As shown in FIG. 3, the source material dispenser 92 can be mounted on a steering mechanism 315 capable of tilting the source material dispenser 92 in different directions to adjust the position of the droplets, with respect to the focal point of the EUV optic mirror 300, and may also translate the droplet generator in small increments along the stream axis. The line between the source material dispenser 92 and the irradiation region 28 defines the first part of a path through the irradiation region 28. As further shown in FIG. 3, the droplets that are not used for the creation of plasma and the material exposed to the laser irradiation are allowed to travel some distance beyond the irradiation region and are intercepted by a catch, which for the case shown includes a structure, e.g., elongated tube 316 (having a cross-section that is circular, oblong, oval, rectangular, square, etc.). In more detail, elongated tube 316 may be positioned to receive target material that has passed through the irradiation region 314 and prevent received material from splashing and reaching the reflective optic. In some cases, the effects of splashing may be reduced or even prevented by using a tube having a relatively large aspect ratio L/W, e.g. greater than about 3, where L is the tube length and W is the largest inside tube dimension normal to L. Upon striking the inner wall of the tube 316, the target material droplets lose their velocity and the target material may then be collected in a dedicated vessel 318, as shown.

FIG. 3 also shows that a physical shroud 320 may be positioned along a portion of the droplet stream with the physical shroud 320 partially surrounding the stream in a plane normal to path direction to increase droplet positional stability. The shroud 320 is physical in the sense that it is a solid shroud, i.e., a shroud composed of a solid material as opposed to a shroud composed of a gas such as the gas shroud described in more detail below.

Figure 4:
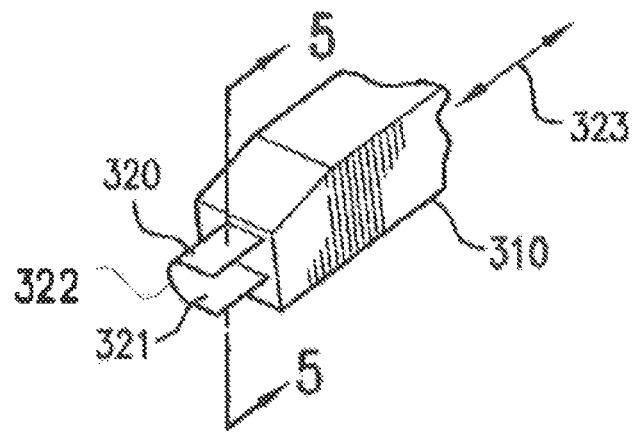
FIG. 4 shows a perspective view of a shroud mounted on a system delivering target material and positioned to extend therefrom toward the irradiation region.
Figure 5:
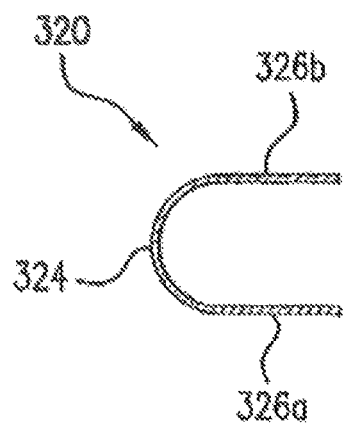
FIG. 5 shows a sectional view of an embodiment of a shroud shaped as a partial ring having a curved region and flat extensions as seen along line 5-5 in FIG. 4.

FIG. 4 shows a perspective view of the physical shroud 320. As shown, the physical shroud 320 may be mounted on system delivering target material 310 and positioned to extend therefrom toward the irradiation region. FIG. 4 shows that the shroud may be formed with a lateral shroud opening 321 extending in the direction of arrow 323. The physical shroud 320 is elongated in the direction of the arrow 323 with the portion extending furthest into the chamber 26 (not shown in FIG. 4) defining a solid shroud end 322. FIG. 5 shows a sectional view of a physical shroud 320. As seen there, the shroud 320 may be shaped as a partial ring, including a "U" shaped cross-section having a curved region 324 and flat extensions 326 a, b. For example, the physical shroud 320 may be made of molybdenum or stainless steel (e.g., 316 stainless) and may extend about 30 mm from the droplet stream output orifice.

Figure 6:
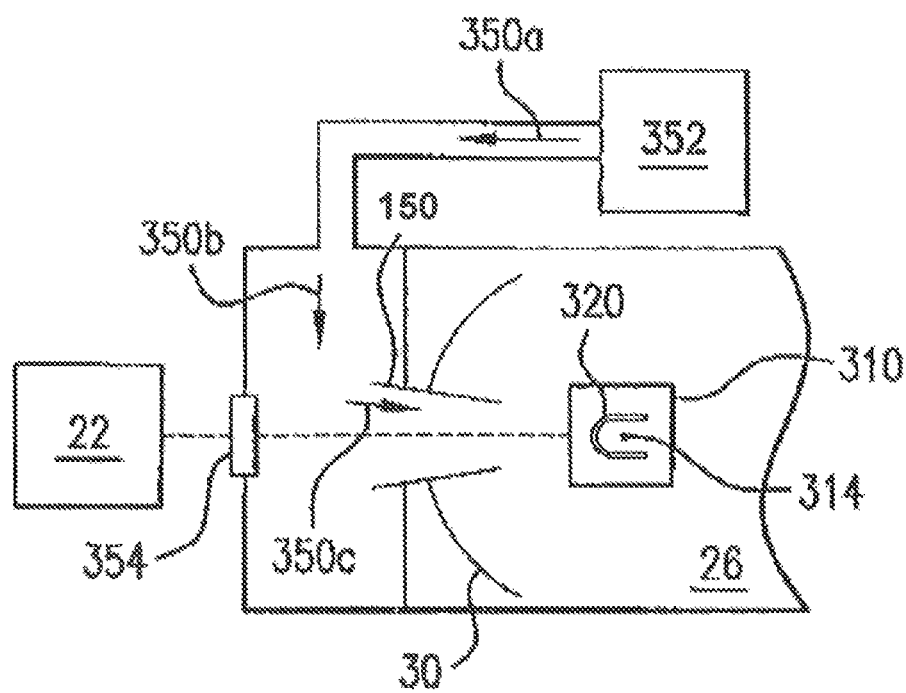
FIG. 6 illustrates a suitable orientation for a shroud relative to gas flow from a gas source in a chamber.

FIG. 6 illustrates a suitable orientation for a physical shroud 320 relative to a gas flow (indicated by arrows 350 a, b, c) from a gas source 352 in the chamber 26. As shown in this embodiment, gas flows through an aperture in the EUV optic 30 and toward irradiation site 314. It can also be seen that light from laser system 22 passes into chamber 26 through a window 354 and through the aperture in the EUV optic 30 to the irradiation site 314. As described above a conical member 150 may be provided to guide flow through an aperture in the EUV optic 30 as shown. FIG. 6 shows that the physical shroud 320 may be oriented with the lateral shroud opening positioned downstream of the gas flow.

Figure 7:
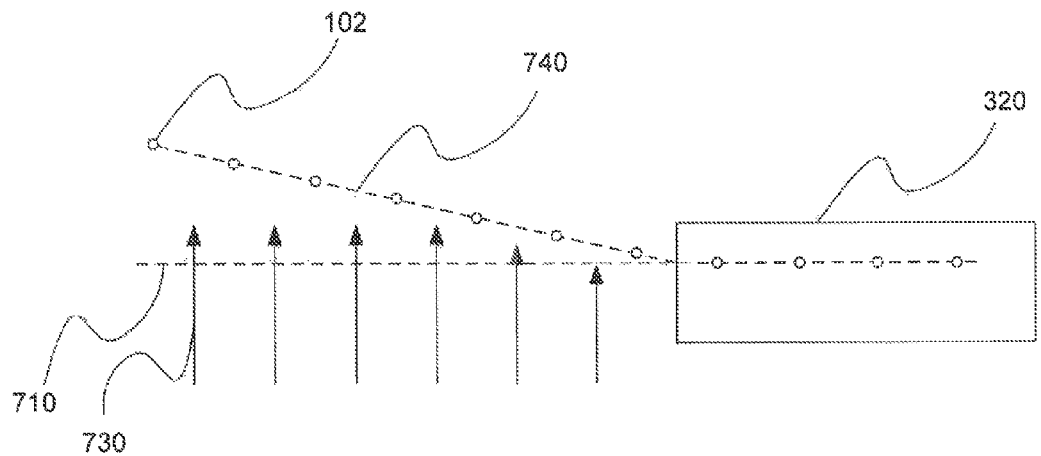
FIG. 7 is a diagram of how gas flow from the direction of an EUV optic can disrupt a droplet stream in a laser-produced-plasma EUV light source.

In systems which use an $H_2$ cone flow as described above, the $H_2$ cone flow can alter the trajectory of the droplets 102 and impairs their stability. This is shown in FIG. 7. In FIG. 7, droplets are released on their intended trajectory 710. A physical shroud 320 helps the droplet 102 maintain the intended trajectory 710 by protecting the droplets 102 from the $H_2$ cone flow depicted as arrows 730. Once the droplets 102 exit the physical shroud 320 they are exposed to the $H_2$ cone flow. The $H_2$ cone flow is then able to deflect the droplets 102 off of the intended trajectory 720 to a deflected trajectory 740 in the direction of flow as indicated by the arrows 130. Although FIG. 7 depicts this process as being linear for the sake of simplicity, it will be understood by one having ordinary skill in the art that the $H_2$ cone flow will have varying effects on each individual droplet 102 so that the $H_2$ cone flow will change the trajectories of the droplets 102 in ways that will not be predictable.

Figure 8:
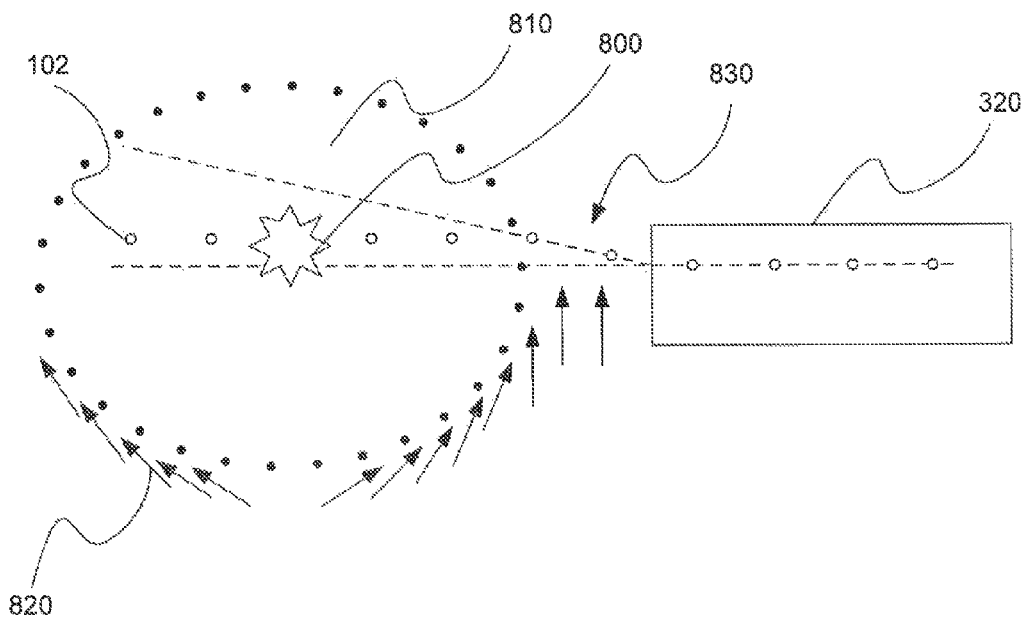
FIG. 8 is a diagram of illustrating a plasma bubble mitigating disruption of a droplet stream caused by gas flow from the direction of an EUV optic in a laser-produced-plasma EUV light source.

With reference to FIG. 8, once a primary plasma 800 has been initiated in the irradiation region, a plasma ball or bubble 810 will form around it. This plasma bubble 810 can to some extent protect the droplets 102 from the $H_2$ cone flow and mitigate deflection as shown. FIG. 8 also illustrates, however, that the $H_2$ cone flow can alter droplet trajectory even after the formation of the plasma bubble 810. In FIG. 8, the gap 830 between the end of the physical shroud 320 and the plasma bubble 810 is an interaction region where a dynamic instability interaction between the $H_2$ cone flow and the droplet 102 may occur.

Using physical shrouds with greater length that extend closer to the plasma bubble 810 decreases the width of the interaction region 830 and protects the droplets 102 closer to the plasma bubble 810. This can improve the dynamic stability of the droplet position and therefore the EUV dose. There are, however, challenges with increasing the physical shroud lengths. For example, increasing the length of the physical shroud (i.e., the dimension parallel to the trajectory of droplets within the physical shroud) increases the thermal stress on the materials making up the physical shroud. Increasing the length of the physical shroud can also result in additional debris directed toward the EUV optic.

Figure 9:
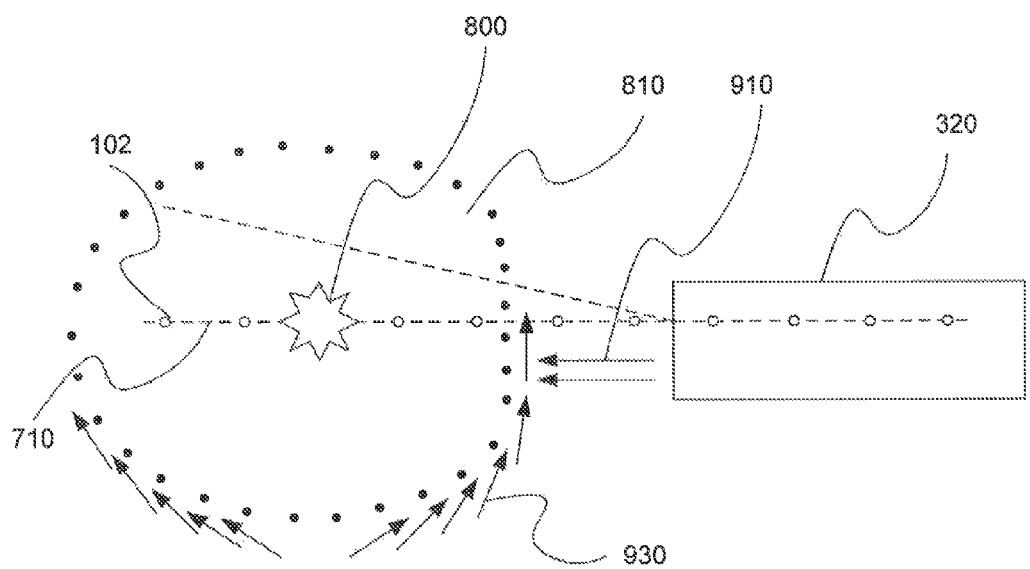
FIG. 9 is a diagram of illustrating a gas shroud mitigating disruption of a droplet stream caused by gas flow from the direction of an EUV optic in a laser-produced-plasma EUV light source.

As shown in FIG. 9, to protect the droplets 102 closer to the plasma bubble 810 without the need for increasing the length of the physical shroud 320, in one embodiment the arrangement includes provision for a gas shroud 910. The gas shroud 910 is arranged to protect the droplets 102 in the physical space (interaction region) between the physical shroud 320 and the plasma bubble 810 and so to reduce or eliminate interaction between the droplets 102 and the $H_2$ gas cone.

The gas shroud 910 may be formed of any suitable gas, such as $H_2$. It is preferably created by causing a high-velocity hydrogen flow along the intended droplet trajectory 710. The hydrogen flow along the intended droplet trajectory 740 disrupts the flow of transverse hydrogen from the EUV optic cone, i.e., the $H_2$ cone flow, and provides a consistent force along the intended direction of droplet travel.

The flow along the droplet axis works in tandem with the observed plasma physics that create the plasma bubble 810 in the irradiation region at steady state. The disrupted $H_2$ cone flow is forced around the plasma bubble 810 and around the gas shroud 910. The combination of the plasma bubble 810 and the shroud flow provides protection from the dynamic instabilities that are associated with variations in droplet lateral displacement (pushout) and the transverse $H_2$ cone flow.

As shown in FIG. 9, the gas shroud 910 may deform the plasma bubble 810 to some extent. This effect may be exploited so that the plasma bubble 810 does not expand too close to the physical shroud 320. As mentioned above, if the physical shroud 320 gets too close to the plasma bubble 810 the physical shroud 320 may become overheated. The physical shroud 320 may also accumulate excessive amounts of source material, e.g., tin, on its surface. This accumulated tin may then propagate from the surface of the physical shroud 320 to the EUV optic 30 (not shown) and so contaminate the EUV optic 30. Also, cooling of the physical shroud 320 becomes inefficient once the plasma bubble 810 reaches the physical shroud 320.

Figure 10:
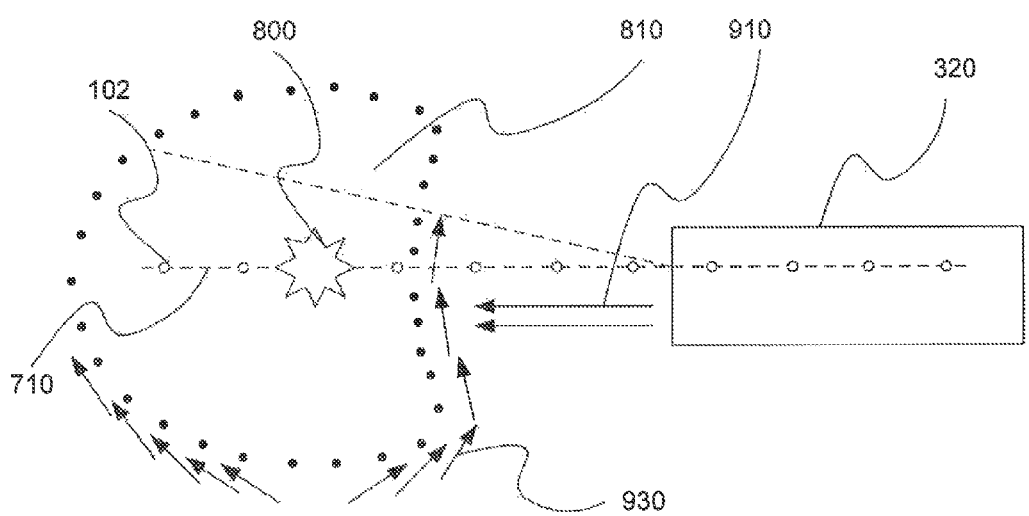
FIG. 10 is a diagram of illustrating a gas shroud mitigating physical shroud heating and source material accumulation on a physical shroud in a laser-produced-plasma EUV light source.

The gas shroud 910 can also mitigate this effect. The flow inside or outside the physical shroud 320 in the direction towards the primary plasma 800 pushes the plasma bubble 810 away from the physical shroud 320, thus reducing the heating of the physical shroud 320 and the flux of tin towards the physical shroud 320. This is shown in FIG. 10. Optimally, the flow rate of the gas making up the gas shroud 320 is sufficient to maintain the plasma bubble 810 at a predetermined distance from the physical shroud end 322.

In a preferred embodiment, the $H_2$ flow rate may be in the range of about 1 to about 20 standard liters per minute (slm) but both lower and higher flow rates may be used. Also, the flow can be delivered through a number of small jets.

Figure 11:
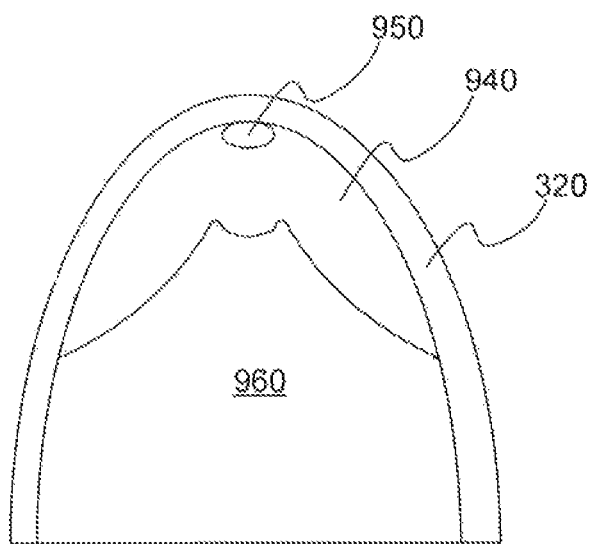
FIG. 11 is a cross-sectional view of a possible nozzle arrangement for directing gas flow to within a physical shroud to form a gas shroud in a laser-produced-plasma EUV light source.

The gas shroud 910 can be created by any suitable arrangement for causing high velocity flow along the droplet intended trajectory. For example, the physical shroud 320 can be provided with gas supply lines from a base attachment on an assembly supporting the EUV optic 30, and a nozzle structure can be added to the interior of the physical shroud 320. Such a nozzle assembly is shown in FIG. 11, in which gas flowing along the long axis of the physical shroud 320 (perpendicular to the plane of the figure) is introduced into a plenum 940 through a port 950. The shape of the plenum 940 is defined by an interior surface of the physical shroud 320 and insert 960 in the physical shroud 320. As can be seen, in a preferred embodiment the insert 960 is substantially mirror symmetric with two lateral wings joined by a central rounded portion. Other shapes are possible.

Figure 12:
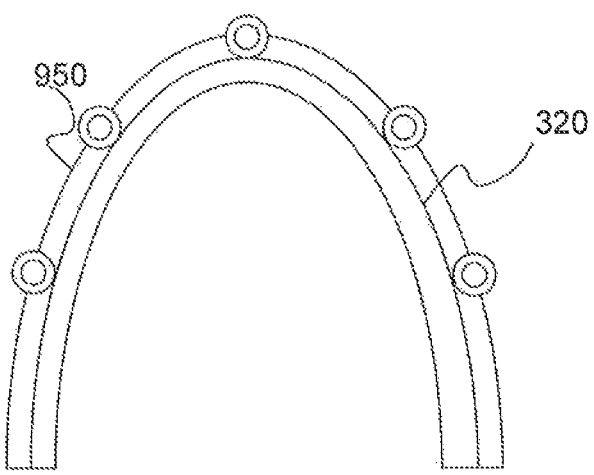
FIG. 12 is a cross-sectional view of another possible nozzle arrangement for directing gas flow to outside of a physical shroud to form a gas shroud in a laser-produced-plasma EUV light source.

FIG. 11 shows an arrangement in which gas for the gas shroud 910 is supplied through the interior of the physical shroud 320. It is also possible to supply gas for the gas shroud 910 through the exterior of the physical shroud 320. Such an arrangement is shown in FIG. 12 in which the exterior (i.e., side facing the EUV optic flow) of the physical shroud 320 is supplied with a nozzle array 950. The nozzles in the nozzle array are positioned substantially symmetrically about a line of symmetry of the physical shroud 320. The nozzle array 950 is directed to direct the flow of gas parallel to the intended droplet trajectory.

Figure 13:
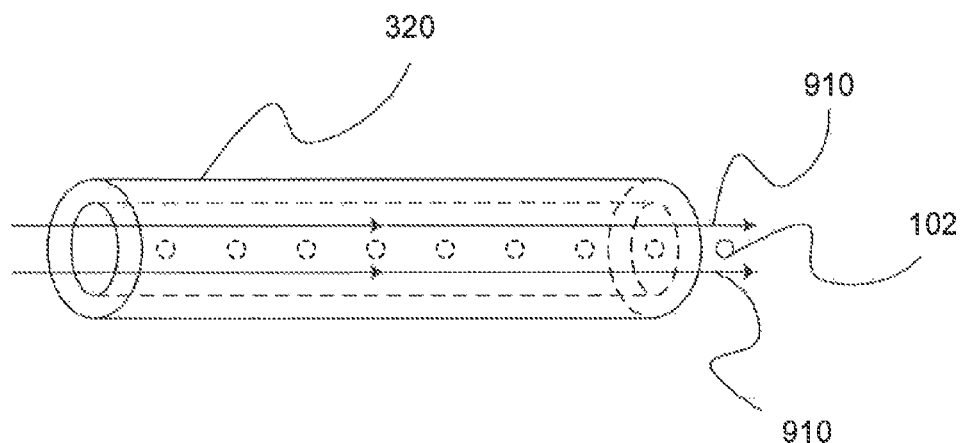
FIG. 13 is a view of another possible physical shroud in a laser-produced-plasma EUV light source.
Figure 14:
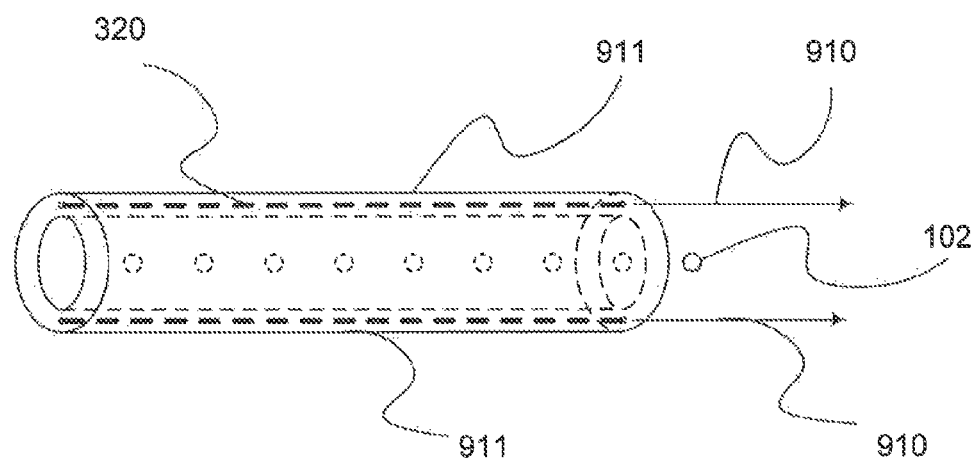
FIG. 14 is another possible physical shroud in a laser-produced-plasma EUV light source.

In the embodiment of FIGS. 12 and 13 the physical shroud 320 is configured in a "U" or "C" shape, with an open side faced away from the cone flow. It is also possible to configure the physical shroud 320 in a closed configuration without an open side. Such an embodiment is shown in FIG. 13, in which the physical shroud is configured as a hollow cylinder. In the embodiment of FIG. 13 the gas for the gas shroud 901 is supplied through the interior of the hollow cylinder through the same channel traversed by the droplets 102. FIG. 14 also shows a physical shroud 320 configured as a hollow cylinder but in which the gas for the gas shroud 910 is supplied through channels 911 in the cylinder walls or a jacket surrounding the cylinder.

It will be readily apparent to one of ordinary skill in the art that other configurations may be used. The number of nozzles and ports and their positioning can be varied. It is also possible to use a combination of one or more interior and exterior nozzles.

Figure 15:
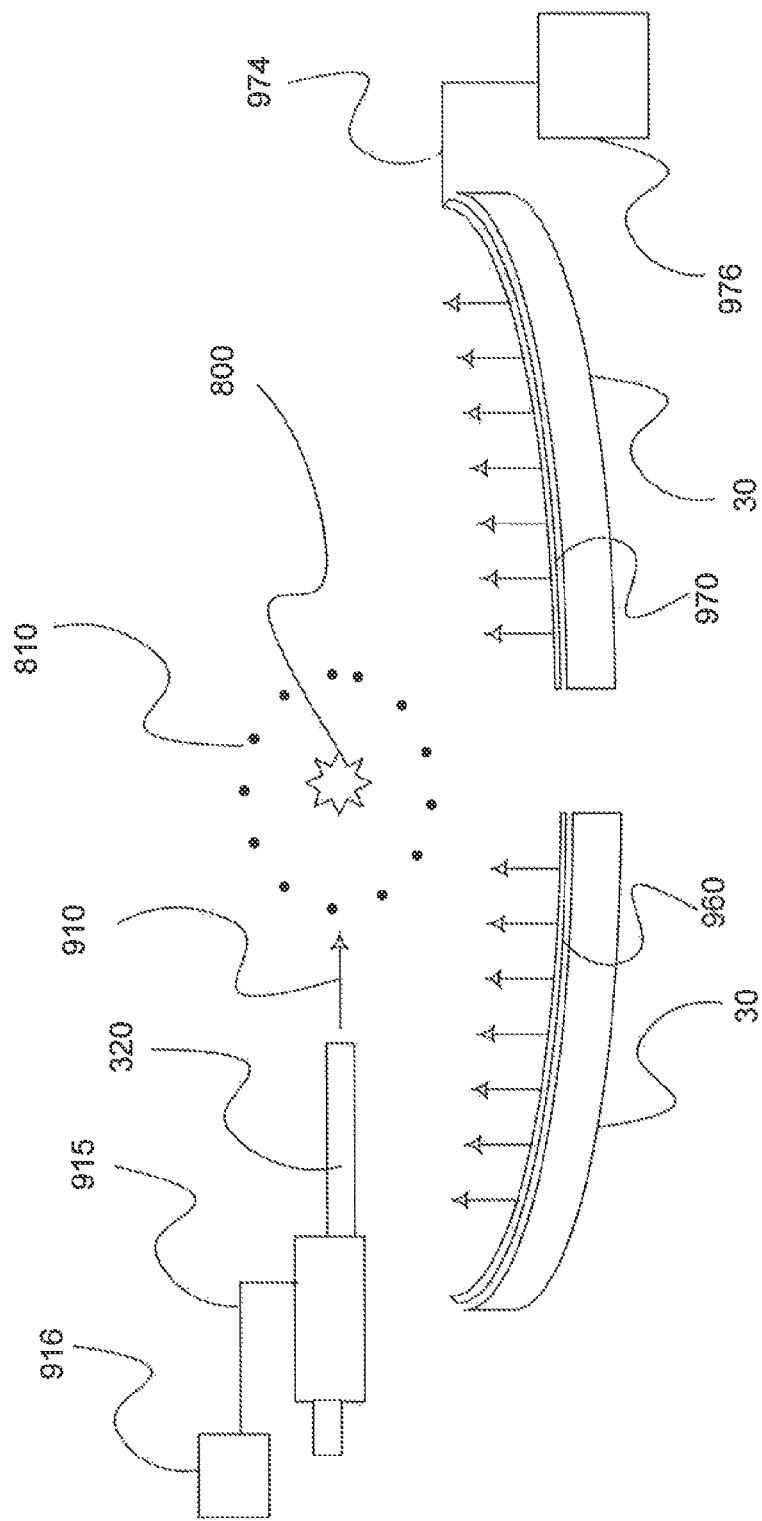
FIG. 15 is a side cross-sectional view of a possible arrangement for directing gas flow to mitigate debris contamination of an EUV optic when using a gas shroud in a laser-produced-plasma EUV light source.

The gas shroud 910 may cause debris and other contaminants to impinge on the EUV optic 30. To mitigate this effect one or more radially extending gas conducting pipes may be installed near the surface of the EUV optic 30 that confronts the irradiation region 28. FIG. 15 shows an arrangement with two such gas conducting pipes 960, 970 but only one or more than two gas conducting pipes may be used. As shown, the gas conducting pipes 960, 970 are preferably installed in a shadow of a horizontal obscuration 980 of the EUV optic 30 caused by the physical shroud 320. The gas conducting pipes 960, 970 include orifices or jets 965, 975 (not shown in FIG. 15 but visible in FIG. 16) that are arranged to cause the flow of $H_2$ towards the physical shroud 320 and away from the EUV optic 30 as indicated by the vertical arrows. The gas conducting pipes 960, 970 are supplied with gas from a gas supply line 974 for supplying gas from a gas source 976. The flow rate through the gas conducting pipes 960, 970 may be may be in the range of about 1 to about 20 standard liters per minute (slm) but both lower and higher flow rates may be used. A higher flow rate will tend to provide greater protection. The gas conducting pipes 960, 970 may be fed with gas at the same rate or may be fed with gas at different rates. FIG. 15 also shows a gas supply line 915 for supplying gas from a gas source 916 to the nozzle (not shown) within the physical shroud 320 to form the gas shroud 910.

Figure 16:
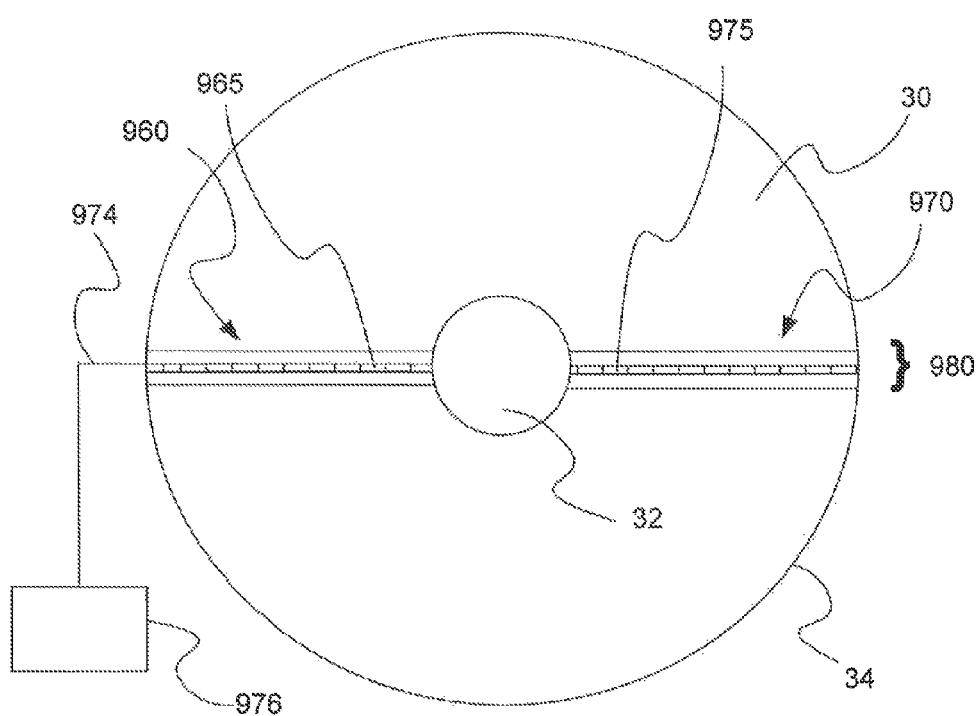
FIG. 16 is a plan view of the arrangement of FIG. 15.

As can be seen more clearly in FIG. 16, the gas conducting pipes 960, 970 are arranged in an opposed spoke-like configuration in front of EUV optic 30 to flow $H_2$ and keep contaminants away from the EUV optic 30. The gas conducting pipes 960, 970 are adjacent a substantially radially symmetric surface of the EUV optic 30 confronting the irradiation region 28 and extend substantially radially at least part of a distance between a central aperture 32 in the EUV optic 30 and an outer circumferential edge 34 of the EUV optic 30. Pipes arranged on both sides of the aperture in the EUV optic 30 in a symmetric arrangement are preferred for active purge or to keep the flow symmetric. Also, to the extent that the flow of gas through the physical shroud 320 has a tendency to blow debris towards the opposite side of the EUV optic 30, the gas conducting pipe on that side of the EUV optic 30 can serve to mitigate this effect.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A device comprising:
   a chamber;
   an EUV source material delivery system having a source material release point and adapted to deliver a stream of source material to a plasma bubble in an irradiation region within the chamber along a path between the source material release point and the irradiation region, the source material delivery system including a solid shroud extending from the source material release point and parallel to the path to a solid shroud end to protect at least a portion of the stream; and
   a gap defined between the solid shroud end and the plasma bubble, the gap being maintained at a predetermined width by gas from a first gas delivery system adapted to cause the gas to flow in the chamber along at least a portion of the path between the solid shroud end and the irradiation region.

2. A device as recited in claim 1 wherein the first gas delivery system is adapted to cause gas to flow in the chamber along at least a portion of the path inside the solid shroud and out of the solid shroud end towards the irradiation region.

3. A device as recited in claim 1 wherein the solid shroud has a length parallel to the path and the first gas delivery system is adapted to cause gas to flow in the chamber outside of the solid shroud and parallel to the length of the solid shroud and towards the irradiation region.

4. A device as recited in claim 1 further comprising an EUV optic and a second gas delivery system adapted to cause gas to flow from the direction of the EUV optic and towards the stream.

5. A device as recited in claim 4 wherein a flow rate at which the first gas delivery system causes gas to flow in the chamber along at least a portion of the path is large enough that the flow of gas from the second gas delivery system does not cause the stream to deviate substantially from the path.

6. A device as recited in claim 4 wherein the EUV optic comprises a collector mirror.

7. A device as recited in claim 4 wherein the second gas delivery system is adapted to cause gas to flow through a central aperture in the EUV optic.

8. A device as recited in claim 4 wherein the second gas delivery system comprises a gas delivery line arranged adjacent a substantially radially symmetric surface of the EUV optic confronting the irradiation region and extending substantially radially at least part of a distance between a central aperture in the EUV optic and an outer circumferential edge of the EUV optic, the qas delivery line having orifices for directing qas substantially perpendicularly away from the surface of the EUV optic.

9. A device as recited in claim 4 wherein the second gas delivery system comprises a first gas delivery line arranged adjacent a substantially radially symmetric surface of the EUV optic confronting the irradiation region, the first gas delivery line extending substantially radially at least part of a distance between a central aperture in the EUV optic and an outer circumferential edge of the EUV optic in a direction substantially parallel to the path, the first gas delivery line having orifices arranged along its length for expelling gas in a direction away from the EUV optic surface.

10. A device as recited in claim 9 wherein the second gas delivery system also comprises a second gas delivery line arranged adjacent a substantially radially symmetric surface of the EUV optic confronting the irradiation region and extending substantially radially at least part of a distance between a central aperture in the EUV optic and an outer circumferential edge of the EUV optic in a direction substantially parallel to the path and radially opposite to the direction from the central aperture than the first gas delivery line.

11. A device as recited in claim 8 wherein the gas delivery line is positioned adjacent a portion of the surface of the EUV optic obscured by the solid shroud.

12. A device comprising:
   a chamber having an irradiation region within;
   a EUV optic with a central aperture;
   a first gas delivery system in fluid communication with an interior of the chamber and adapted to cause gas to flow through the central aperture and towards the irradiation region;
   a source material delivery system having a source material release point within the chamber and adapted to deliver a stream of source material to the irradiation region along a path between the source material release point and the irradiation region, the source material delivery system comprising a solid shroud extending from the source material release point and parallel to the path to protect at least a portion of the stream; and
   a second gas delivery system in fluid communication with the interior of the chamber and adapted to cause gas to flow in the chamber along at least a portion of the path and into a gap defined between the solid shroud end and a plasma bubble established in the irradiation region, the gap being maintained at a predetermined width by gas from the second gas delivery system.

13. A device as claimed in claim 12 further comprising a first gas delivery line arranged adjacent a substantially radially symmetric surface of the EUV optic confronting the irradiation region, the first gas delivery line extending substantially radially at least part of a distance between a central aperture in the EUV optic and an outer edge of the EUV optic in a direction substantially parallel to the path, the first gas delivery line having orifices arranged along its length for expelling gas in a direction substantially perpendicularly away from the EUV optic surface.

14. A device as recited in claim 13 wherein the first gas delivery line is positioned adjacent a portion of the surface of the EUV optic obscured by the solid shroud.

15. A method comprising the steps of:
   directing a stream of EUV source material along a path through a solid shroud between a source material release point in a chamber and an irradiation region in the chamber; and
   streaming gas along at least a portion of the path and into a gap defined by an end of the solid shroud and a plasma bubble formed in the irradiation region in the direction from the end of the solid shroud towards the plasma bubble so as to maintain the gap at a predetermined width.

16. A method as recited in claim 15 wherein streaming step comprises causing gas to flow in the chamber along at least a portion of the path inside the solid shroud and out of the solid shroud end towards the irradiation region.

17. A method as recited in claim 15 wherein the solid shroud has a length parallel to the path and wherein the streaming step comprises causing gas to flow in the chamber outside of the solid shroud and parallel to the length of the solid shroud and towards the irradiation region.

18. A method as recited in claim 15 further comprising a step concurrent with the streaming step of causing gas to flow from the direction of an EUV optic and towards the path.

19. A method as recited in claim 18 wherein said streaming step comprises streaming gas at a flow rate large enough that the flow of gas from the direction of an EUV optic and towards the path does not prevent the source material from passing through the irradiation region.

20. A method as recited in claim 18 further comprising causing gas to flow into the chamber along a length of a gas delivery line arranged adjacent a substantially radially symmetric surface of the EUV optic confronting an irradiation region, the gas delivery line extending substantially radially at least part of a distance between a central aperture in the EUV optic and an outer circumferential edge of the EUV optic, the gas delivery line expelling gas in a direction substantially perpendicularly away from the surface.

* * * * *